(12) United States Patent
Watkins

(10) Patent No.: US 7,956,206 B2
(45) Date of Patent: Jun. 7, 2011

(54) METAL COMPLEX

(75) Inventor: Scott Watkins, Williamstown (AU)

(73) Assignee: Cambridge Display Technology Limited, Cambridgeshire (GB)

( * ) Notice: Subject to any disclaimer, the term of this patent is extended or adjusted under 35 U.S.C. 154(b) by 951 days.

(21) Appl. No.: 11/579,277

(22) PCT Filed: May 17, 2005

(86) PCT No.: PCT/GB2005/001895
§ 371 (c)(1), (2), (4) Date: Nov. 1, 2006

(87) PCT Pub. No.: WO2005/117161
PCT Pub. Date: Dec. 8, 2005

(65) Prior Publication Data
US 2008/0088224 A1   Apr. 17, 2008

(30) Foreign Application Priority Data

May 24, 2004   (GB) .................................. 0411582.0

(51) Int. Cl.
C07F 15/00 (2006.01)
C07F 13/00 (2006.01)
H01J 9/04 (2006.01)
H01J 1/62 (2006.01)

(52) U.S. Cl. ................ 556/21; 556/19; 556/20; 546/10; 445/50; 313/503; 313/504; 313/507

(58) Field of Classification Search .................. 313/503, 313/507, 504; 445/50; 546/10; 556/19, 556/20, 21
See application file for complete search history.

(56) References Cited

U.S. PATENT DOCUMENTS

| 5,061,569 | A | 10/1991 | VanSlyke et al. |
| 5,554,450 | A | 9/1996 | Shi et al. |
| 5,723,873 | A | 3/1998 | Yang |
| 5,777,070 | A | 7/1998 | Inbasekaran et al. |
| 5,798,170 | A | 8/1998 | Zhang et al. |
| 5,853,905 | A | 12/1998 | So et al. |
| 6,268,695 | B1 | 7/2001 | Affinito |
| 2002/0048689 | A1 | 4/2002 | Igarashi et al. |
| 2002/0134984 | A1 | 9/2002 | Igarashi |
| 2003/0186080 | A1 | 10/2003 | Kamatani et al. |
| 2005/0031904 | A1 | 2/2005 | Igarashi et al. |
| 2005/0147843 | A1 | 7/2005 | Kobayashi et al. |

FOREIGN PATENT DOCUMENTS

| EP | 0901176 A2 | 10/1999 |
| EP | 0949850 A1 | 10/1999 |
| EP | 0947123 B1 | 2/2002 |
| EP | 1353388 A2 | 10/2003 |
| GB | 2348316 A | 9/2000 |
| JP | 2002/173674 | 6/2002 |
| JP | 2002/203678 | 7/2002 |
| WO | WO-98/10621 | 3/1998 |
| WO | WO-00/48258 | 8/2000 |
| WO | WO-00/53656 | 9/2000 |
| WO | WO-00/55927 | 9/2000 |
| WO | WO-00/70655 | 11/2000 |
| WO | WO-01/19142 A1 | 3/2001 |
| WO | WO-01/81649 A1 | 11/2001 |
| WO | WO-02/066552 A1 | 8/2002 |
| WO | WO-03/084973 A1 | 10/2003 |
| WO | WO-03/091355 A2 | 11/2003 |
| WO | WO-2004/016710 A1 | 2/2004 |

OTHER PUBLICATIONS

Bernhard et al., "Efficient Electroluminescent Devices Based on a Chelated Osmium(II) Complex," *Adv. Mater.*, 14:433-436 (2002).
Chen et al., "Triplet Exciton Confinement in Phosphorescent Polymer Light-emitting Diodes," *Appl. Phys. Lett.*, 82(7):1006-1008 (2003).
Cleave et al., "Harvesting Singlet and Triplet Energy in Polymer LEDs," *Adv. Mater.*, 11(4):285-288 (1999).
Gong et al., "Electrophosphorescence From a Conjugated Copolymer Doped with an Iridium Complex: High Brightness and Improved Operational Stability," *Adv. Mater.*, 15(1):45-49 (2003).
Ikai et al., "Highly Efficient Phosphorescence from Organic Light-emitting Devices with an Exciton-block Layer," *App. Phys. Lett.*, 79(2):156-158 (2001).
Kreyenschmidt et al., "Thermally Stable Blue-light-emitting Copolymers of Poly(alkylfluorene)," *Macromolecules*, 31:1099-1103 (1998).
Lane et al., "Origin of Electrophosphorescence from a Doped Polymer Light Emitting Diode," *Phys. Rev. B.*, 63:235206-1-235206-8 (2001).
Lee et al., "Polymer Phosphorescent Light-emitting Devices Doped with Tris(2-phenylpyridine) Iridium as a Triplet Emitter," *Appl. Phys. Lett.*, 77(15):2280-2282 (2000).
Lees, "Luminescence Properties of Organometallic Complexes," *Chem. Rev.*, 87:711-743 (1987).
Noh et al., "Energy Transfer and Device Performance in Phosphorescent Dye Doped Polymer Light Emitting Diodes," *J. Chem. Phys.*, 118(6):2853-2864 (2003). Noh et al., "Singlet and Triplet Energy Transfer in Phosphorescent Dye Doped Polymer Light Emitting Devices," *Mat. Res. Soc. Symp. Proc.*, 708:131-136 (2002).
O'Brien et al., "Electrophosphorescence from a Doped Polymer Light Emitting Diode," *Synthetic Metals*, 116:379-383 (2001).
Schiemenz, "Dipenyl-p-Bromophenylphosphine," *Organic Syntheses*, 49:66-69 (1969).
Shirota, "Organic Materials for Electronic and Optoelectronic Devices," *J. Mater. Chem.*, 10:1-25 (2000).
Uhlig et al., "Triphenylphosphan-Komplexe des Nickel(0) mit Stickstoffheterocyclen als Zweitliganden," *Zeitschrift fur Angorganische and Allgemeine Chemie*, 418(1):45-53 (1975).

(Continued)

Primary Examiner — Porfirio Nazario Gonzalez

(74) Attorney, Agent, or Firm — Marshall, Gerstein & Borun LLP

(57) ABSTRACT

A light emitting device comprising an anode, a cathode, a light emissive layer located between the anode and the cathode, said light emissive layer comprising a compound for emitting light, said compound comprising a metal complex and X, said metal complex containing a metal (M) and a phosphorous atom that is coordinated directly to M, and an aryl or heteroaryl group $Ar^s$ that is directly bonded to the phosphorous atom, where $Ar^s$ is substituted with X, and characterized in the X comprises an aryl or heteroaryl group.

25 Claims, 1 Drawing Sheet

OTHER PUBLICATIONS

Volman et al., "Advances in Photochemistry," *Photochemistry and Luminescence of Cyclometallated Complexes*, Ch. 17, pp. 1-68 (1992).

Watkins et al., "Towards Co-operative Reactivity in Conjoint Classical-organometallic Heterometallic Complexes: The Co-ordination Chemistry of Novel Ligands with Triphenylphosphine and Bis(pyridylethyl)amine or Triazacyclononane Domains," *J. Chem. Soc., Dalton Trans.*, 2423-2436 (2002).

Zhu et al., "Synthesis of New Iridium Complexes and Their Electrophosphorescent Properties in Polymer Light-emitting Diodes," *J. Mater. Chem.*, 13:50-55 (2003).

International Search Report for International Application No. PCT/GB2005/001895, dated Dec. 9, 2005.

Search Report for Application No. GB0411582.0, dated Oct. 27, 2004.

Written Opinion for International Application No. PCT/GB2005/001895, dated Dec. 9, 2005.

Demas et al., "Design and Applications of Highly Luminescent Transition Metal Complexes," *Analytical Chem.*, 63(17):829A-837A (1991).

METAL COMPLEX

BACKGROUND OF THE INVENTION

1. Field of the Invention

The invention relates to a metal complex and to a method of making the same. The invention also relates the use of the metal complex, to a light emitting device including the metal complex, and to a method of making the light emitting device.

2. Related Technology

Much effort has been devoted to the improvement of the emission efficiency of light-emitting devices (LEDs) either by developing highly efficient materials or efficient device structures.

FIG. 1 shows cross-section of a typical LED. The device has an anode 2, a cathode 5 and a light emissive layer 4 located between the anode and the cathode. The anode may be, for example, a layer of transparent indium tin oxide. The cathode may be, for example, LiAl. Holes and electrons that are injected into the device recombine radiatively in the light emissive layer. A further feature of the device is the optional hole transport layer 3. The hole transport layer may be a layer of polyethylene dioxythiophene (PEDOT) for example. This provides an energy level which helps the holes injected from the anode to reach the light emissive layer.

Known LED structures also may have an electron transport layer situated between the cathode 5 and a light emissive layer 4. This provides an energy level which helps the electrons ejected from the cathode to reach the light emissive layer.

In an LED, the electrons and holes that are injected from the opposite electrodes are combined to form two types of exitons; spin-symmetric triplets and spin-anti-symmetric singlets. Radiative decay from the singlet (fluorescence) is fast, but from the triplet (phosphorescence) is formally forbidden by the requirement of the spin conservation.

Many have studied the incorporation of phosphorescent materials into the light emissive layer by blending. Often, the phosphorescent material is a metal complex, however it is not so limited. Further, metal complexes also sometimes are fluorescent.

A metal complex will comprise a metal ion surrounded by ligands. A ligand in a metal complex can have several roles. The ligand can be an "emissive" ligand which accepts electrons from the metal and then emits light. Alternatively, the ligand may be present simply in order to influence the energy levels of the metal. For example, where emission is from a ligand, it is advantageous to have strong field ligands coordinated to the metal to prevent energy loss via non-radiative decay pathways. Common strong field ligands are known to those skilled in this art and include CO, $PPh_3$, and ligands where a negatively charged carbon atom bonds to the metal. N-donor ligands are also strong field ligands, although less so than those previously mentioned.

The effect of strong field ligands can be appreciated from an understanding of the mechanism by which light is emitted from a metal complex. Three reviews of luminescent metal complexes that provide an appreciation of this mechanism are referred to below.

Chem. Rev., 1987, 87, 711-7434 is concerned with the luminescence properties of organometallic complexes. This review paper provides a brief summary of the excited states commonly found in organometallic complexes. The excited states that are discussed include metal-to-ligand charge-transfer (MLCT) states, which involve electronic transitions from a metal-centered orbital to a ligand-localized orbital. Thus, in a formal sense this excitation results in metal oxidation and ligand reduction. These transitions are commonly observed in organometallic complexes because of the low-valent nature of the metal centre and the low-energy position of the acceptor orbitals in many ligands. Ligand to metal charge-transfer (LMCT) states also are mentioned which involve electronic transitions from a ligand-localized orbital to a metal-centered orbital.

In the section of the article that deals with photoluminescence, a sub-section is dedicated to metal carbonyl complexes, which are said to be recognized as being some of the most light-sensitive inorganic materials. Examples include $M(CO)_6^-$ (M=V, Nb, Ta); and $M(CO)_6$ (M=Cr, Mo, W).

Matrix isolation studies of $M(CO)_5L$ complexes, where M=Mo or W and L=pyridine, 3-bromopyridine, pyridazine, piperidine, trimethylphosphine, or trichlorophosphine, are reported also as they are said to have provided the first reports of fluorescence from substituted metal carbonyls.

Several $Mo(CO)_5L$ complexes, where L=a substituted pyridine ligand, are also mentioned and it is said that they are known to luminesce under fluid conditions. The emission has been assigned to a low-lying MLCT excited state.

Other sub-sections in this review article are dedicated to dinitrogen complexes; metallocenes; metal isocyanides; alkenes; and ortho-metallated complexes.

It is said that a number of examples of ortho-metallated complexes have been shown to luminesce in room temperature solutions. For example, the emission spectrum of $[Ru(bpy)_2(NPP)]^+$ is said to exhibit the structure associated with MLCT emission. Several ortho-metallated Pt(II) complexes also are mentioned where it is said that the emission may be assigned to a MLCT excited state.

The review article summarizes that low-lying MLCT excited states are often observed, because of the low-valent metal centres and vacant low-energy ligand acceptor orbitals in organometallic complexes. Further, it is reported that relationships exist between the energy ordering of the excited-state levels and the observed photophysical and photochemical properties. Still further, it is said that the great majority of examples of room temperature emission have been attributed to MLCT excited states.

Analytical Chemistry, Vol. 63, No, 17, Sep. 1, 1991, 829A to 837A is concerned with the design and applications of highly luminescent transition metal complexes especially those with platinum metals (Ru, Os, Re, Rh and Ir).

Table I in this paper lists representative metal complexes categorized by luminescence efficiency. The systems are limited to those containing at least one α-diimine ligand such as 2,2'-bipyridine (bpy) or 1,10-phenanthroline (phen), although many of the design rules and fundamental principles are said to apply to other classes of luminescent metal complexes.

In this paper it is explained that transition metal complexes are characterized by partially filled d orbitals and that to a considerable extent the ordering and occupancy of these orbitals determine emissive properties.

For a representative octahedral $MX_6$ $d^6$ metal complex, where M is the metal and X is a ligand that coordinates at one site, it is explained that the octahedral crystal field of the ligands splits the five degenerate d orbitals into a triply degenerate t level and a doubly degenerate e level. The magnitude of the splitting is given by the crystal field splitting, which is a particularly important parameter for determining the luminescence properties of the complex, whose size is determined by the crystal field strength of the ligands and the central metal ion. The luminescence properties of the complex thus can be controlled by altering the ligand, geometry, and metal ion.

There are three types of excited states mentioned in this paper: metal-centred d-d states, ligand-based π-π* states, and charge-transfer states.

Charge-transfer (CT) states involve both the organic ligand and the metal. As mentioned above, metal-to-ligand charge transfer (MLCT) involves promoting an electron from a metal orbital to a ligand orbital and ligand-to-metal charge transfer (LMCT) involves promoting an electron from a ligand to a metal orbital.

According to this paper, the most important design rule of luminescent transition metal complexes is that the emission always arises from the lowest excited state. Thus control of the luminescence properties of complexes hinges on control of the relative state energies and the nature and energy of the lowest excited state. In this regard, the paper states that any metal-centred d-d states must be well above the emitting level to prevent their thermal excitation, which would result in photochemical instability and rapid excited-state decay. Therefore, one of the more important criteria is to remove the lowest d-d state from competition with the emitting level. Thus a desirable design goal is to make the d-d state as thermally inaccessible as possible from the emitting MLCT or π-π* state. Controlling the energies of the d-d states is accomplished by varying either the ligands or the central metal ion to affect the crystal field splitting. Stronger crystal field strength ligands or metals raise d-d state energies, and crystal field strength increases in the series Cl <py <<bpy, phen <CN <CO where py represents pyridine.

For a metal, the crystal field splitting increases when descending a column in the periodic table. CT state energies are affected by the ease of oxidation/reduction of the ligands and metal ion. For MLCT transitions, more easily reduced ligands and more easily oxidated metals lower the MLCT states.

The π-π* state energies are largely dictated by the ligands themselves. However, the energies and intensities of the π-π* transitions can be altered by varying either the substituents, the heteroatoms in the aromatic ring, or the extent of π conjugation.

Photochemistry and Luminescence of Cyclometallated Complexes, Advances in Photochemistry, Volume 17, 1992, page 1 to 68 describes that most of the attention in this field has been focused on complexes of the polypyridine-type family (prototype: Ru(bpy)$^{2+}_3$, where bpy=2,2' bipyridine).

The interest in the photochemical and photophysical properties of cyclometallated complexes is said to be an extension of this.

Table 2 in this publication shows absorption and emission properties of cyclometallated ruthenium, rhodium, iridium, palladium and platinum complexes and their ligands.

Metal complexes containing a PPh$_3$ strong field ligand are disclosed, for example in JP 2002-173674, which discloses a rhenium complex as shown below.

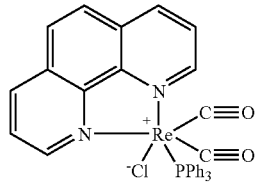

Among others, tungsten, osmium, nickel and platinum complexes with PPh$_3$ ligands of the type shown below are known.

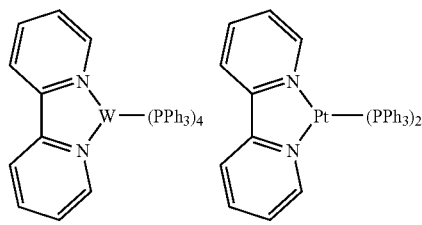

For example, see Journal of the Chemical Society, Dalton Transactions: Inorganic Chemistry (1972-1999) (1986), (3), 511-15 (tungsten) and Zeitschrift fur Anorganische und Allgemeine Chemie (1975), 418(1), 45-53 (nickel).

Also, the following osmium complex is known from Adv. Mat. 2002, 14, 433.

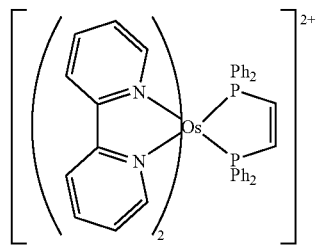

The following complex is disclosed in EP 1353388:

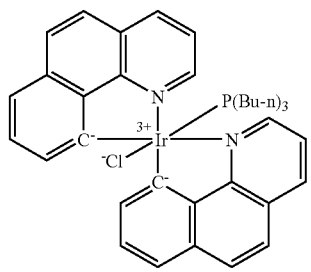

and the following complex is disclosed in JP 2002-203678:

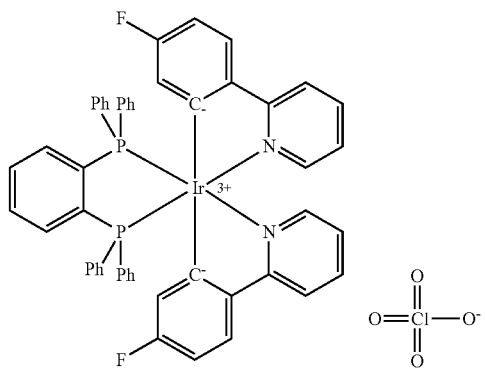

The PPh₃ ligands in these complexes are not emissive ligands.

Further complexes which are comprised of two different types of reactive metal centre linked by a di-topic ligand are disclosed in J. Chem. Soc. Dalton Trans. 2002, 2423-2436. It is said in this paper that triphenylphosphine is one of the more commonly used ligands in organic chemistry and is one of the most common ligands found in homogenous transition metal catalysts. As such, this paper is not concerned specifically with the field of light emitting devices but rather with the use of metal complexes as catalysts. Various PPh₃ complexes are mentioned.

One problem associated with metal complexes including those with a PPh₃ ligand relates to aggregation, which leads to triplet quenching and also reduces the efficiency of exiton transfer. Further, many metal complexes with a PPh₃ ligand are not solution processable. This creates problems during manufacture of a light emitting device where it is advantageous to be able to cast the layer of the device by solution processing. A further problem relates to phase separation of the metal complex and the host material, where a separate host material is used.

In view of the above, it will be appreciated that there is a need to improve known metal complexes, many of which contain a PPh₃ ligand, for use in light emitting devices.

SUMMARY OF THE INVENTION

As such, a first aspect of the invention provides a light emitting device comprising an anode; a cathode; a light emissive layer located between the anode and the cathode, said light emissive layer comprising a compound for emitting light, said compound comprising a metal complex and X, said metal complex containing a metal (M) and a phosphorous atom that is coordinated directly to M; and an aryl or heteroaryl group $Ar^s$ that is directly bonded to the phosphorous atom; where $Ar^s$ is substituted with X; and characterised in that X comprises an aryl or heteroaryl group.

A second aspect of the invention provides a method of making a light emitting device as defined above, comprising the steps of forming the anode, the cathode and the light emissive layer so that the light emissive layer is located between the anode and the cathode.

A third aspect of the invention provides a reactive compound for making a compound for emitting light in a light emitting device, said reactive compound comprising a metal complex, said metal complex containing a metal (M) and $P(Ar^s)(R)(R')$, where P is coordinated directly to M; $Ar^s$ is an aryl or heteroaryl group; R and R' independently represent H, a halide group, or a substituted or unsubstituted alkyl, aryl or heteroaryl group; and where $Ar^s$ is substituted with one or more reactive groups, wherein the or each reactive group is selected from the group consisting of a triflate group, halide group, a boronic acid group, a boronic ester group and a borane group.

A fourth aspect of the invention provides a method for making a compound for emitting light in a light emitting device using the reactive compound as defined in relation to the third aspect.

A fifth aspect of the invention provides a compound for emitting light in a light emitting device, said compound comprising a metal complex and X, said metal complex containing a metal (M) and a phosphorous atom that is coordinated directly to M; and an aryl or heteroaryl group $Ar^s$ that is directly bonded to the phosphorous atom; where $Ar^s$ is substituted with X; and characterised in that X comprises an aryl or heteroaryl group and $Ar^s$ is conjugatively linked to the aryl or heteroaryl group.

A sixth aspect of the invention provides the use of a compound for emitting light, said compound comprising a metal complex and X, said metal complex containing a metal (M) and a phosphorous atom that is coordinated directly to M; and an aryl or heteroaryl group $Ar^s$ that is directly bonded to the phosphorous atom; where $Ar^s$ is substituted with X; and characterised in that X comprises an aryl or heteroaryl group.

DETAILED DESCRIPTION

Figure 1:
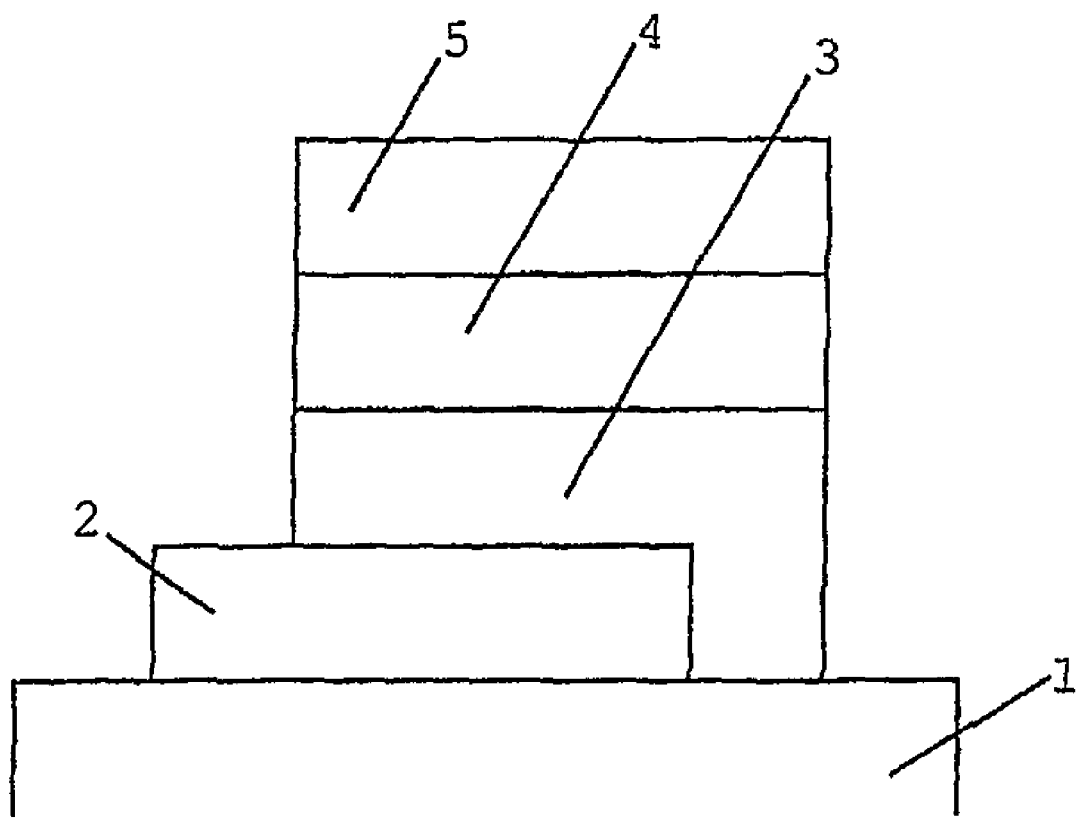
FIG. 1 shows a cross-section of a typical light-emitting diode (LED).

The compound comprised in the light emissive layer of the device according to the first aspect of the invention now will be described in more detail.

Optionally, X comprises an aryl or heteroaryl group and $Ar^s$ is conjugatively linked to the aryl or heteroaryl group.

According to the invention, the functionality X is introduced on a non-emitting ligand. This has associated advantages as compared with introducing X on an emitting ligand because it does not interfere with the emission colour or other properties associated with light output and emission.

$Ar^s$ may be further substituted.

Since the phosphorous atom is coordinated directly to M it will be understood that the metal complex contains a phosphorous-containing ligand. The phosphorous atom can be in oxidation state +3 or +5. In either case generally, the phosphorous atom will be bonded to two further groups (R and R'), in addition to $Ar^s$. Preferably, the two further groups (R and R') each independently comprise H; a halide group (preferably F); or substituted or unsubstituted alkyl (preferably $CH_3$), aryl or heteroaryl group.

In one embodiment, preferably, at least one of R and R' is a substituted or unsubstituted aryl or heteroaryl group. More preferably, R and R' each independently is a substituted or unsubstituted aryl or heteroaryl group. Still more preferably, R is a substituted or unsubstituted phenyl group and R' independently is a substituted or unsubstituted phenyl group.

In another embodiment, at least one of R and R' is H, a halide group (preferably F) or a methyl group. These small R and R' groups are preferred when X is a large group in order to avoid crowding.

In the case of P(V), typically the phosphorous atom also will be bonded to an oxygen (P=O).

In the compound, X effectively functionalises the metal complex. As such, metal complexes disclosed in the prior art containing phosphine ligands or other $P(Ar^s)(R)(R')$ containing ligands can be functionalised to give compounds according to the present invention by the introduction of X on one of the phenyl groups of the phosphine ligand (or on $Ar^s$ in the case of another $P(Ar^s)(R)(R')$ containing ligand). Such complexes include rhenium, tungsten, platinum, palladium, copper, chromium, molybdenum, rhodium, iridium, gold, ruthenium, and osmium complexes. Such complexes also include fluorescent complexes where M is gallium, aluminium, beryllium, zinc, mercury or cadmium. These are discussed in more detail below in relation to general formulae I to X where at least one L in these general formulae comprises $P(Ar^s)(R)(R')$ as defined above.

The present compound comprised in the emissive layer can be a small molecule, oligomer, polymer or dendrimer.

X may be considered as a functionality on $Ar^s$. In this regard, the function of X may be, for example, to improve solubility of the compound as a whole, to aid electron transport and/or to aid hole transport in the device. Suitable groups for these functions will be known to a person skilled in the art. For example, preferred solubilising groups include alkyl and alkoxy groups. Further, preferred groups for electron and/or hole transport include those selected from the group consisting of 2,7-linked 9,9 disubstituted fluorene, a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene, a substituted or unsubstituted triarylamine and an unsubstituted or substituted carbazole. Unsubstituted and substituted carbazoles are particularly preferred.

In a first embodiment of the first aspect of the invention X comprises a polymer or oligomer. As discussed below, the polymer may be partially or fully conjugated.

In the first embodiment $Ar^s$ may be pendant from the backbone of the polymer or oligomer. Alternatively, $Ar^s$ may be part of the backbone of the polymer or oligomer. In this sense, the metal complex may be a repeat unit, side chain substituent or end group in the polymer or oligomer.

When $Ar^s$ is part of the backbone of the polymer or oligomer, $Ar^s$ may be considered to be difunctionalised because it will be joined into the backbone in two places:

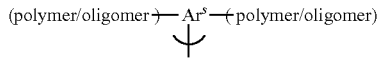

Where $Ar^s$ is pendant from the backbone of the polymer or oligomer to form a side chain substituent or where it forms an end group, $Ar^s$ may be considered to be monofunctionalised.

Problems relating to morphology changes such as aggregation and phase separation are avoided with the compound according to the first embodiment of the invention. The controlled structure of the compound means that the location and mobility of the metal complex is spatially controlled. This spatial control enables control of the interaction between the polymer or oligomer and the metal complex. This, in turn, enables manipulation, to some extent, of the energy levels of the material in its excited state when the metal complex is conjugatively linked to the polymer or oligomer because of synergistic effects between the polymer or oligomer and the metal complex.

When the metal complex is conjugatively linked to the polymer or oligomer, this may lead to mixing of the energy levels as described in WO 03/091355 (the contents of which are incorporated herein by reference). This mixing of energy levels can help energy transfer from the polymer or oligomer to the ligand. Charge transport from the polymer or oligomer to the organometallic group may also be enhanced as compared to prior art blends of organometallic compounds and polymers.

Generally, an increase in the extent of conjugation in a material can be said to lower the triplet energy level of that material. As such, controlling the extent of conjugation in the present compound can be a useful method of controlling at least partially the triplet energy levels. In this regard, in one embodiment, it is preferred that the backbone of the polymer or oligomer is partially conjugated, more preferably substantially or even fully conjugated.

In order to control the extent of conjugation of the polymer or oligomer, it is preferred that the polymer or oligomer comprises an aryl or heteroaryl repeat unit, for example a carbazole, triarylamine, fluorene or phenyl group, such as a phenylene vinylene group. Thus, in the first embodiment, X preferably comprises a carbazole, triarylamine, fluorene or phenylene based polymer. Carbazole and triarylamine based polymers are most preferred.

Other useful aryl or heteroaryl repeat units are: substituted or unsubstituted benzothiadiazole, and substituted or unsubstituted thiophene.

Any polymer or oligomer can be used so long as its energy levels are complimentary to the metal complex so that the compound is capable of emitting light.

The polymer or oligomer may be functional in the light-emitting device. For example, the polymer or oligomer may be electron transporting or hole transporting. To this end, the inventors have found that the polymer or oligomer preferably is conducting or semiconducting and, more preferably, semiconducting.

It may be preferable for the polymer or oligomer to include solubilising groups in order to improve the solubility of the material. Preferred solubilising groups include alkyl and alkoxy groups. In this regard, it is preferred that the material is solution-processable.

In the first embodiment of the first aspect of the invention, the present material may contain more than one metal complex. In this case, spatial separation of the metal complexes in the material becomes more important. Spatial separation may be controlled by the method of manufacture as described in more detail below or by selecting the metal complexes to be pendant from the backbone of the polymer or oligomer.

With a view to further controlling the properties of the material, a spacer group may be used to interrupt conjugation in the material. Accordingly, X may contain a non-conjugated spacer group such as an optionally substituted C1-C10 alkylene group. Alkylene groups are useful for controlling the distance between the polymer or oligomer and the metal complex, thus improving charge trapping. In this regard alkyl groups and alkyl-ether groups are suitable spacer groups. The length of the spacer group also can be used to control to some extent the separation of the metal complex from the polymer or oligomer backbone. As such, the spacer group suitably may be a chain of $CH_2$ groups.

In a second embodiment of the first aspect of the invention, M is comprised in the core of a dendrimer. As such, the second embodiment relates to dendrimers with metal ions as part of the core.

The properties of dendrimers make them ideal for solution processing and allow incorporation of a metal complex into a solution processable system. WO 02/066552 (the contents of which are incorporated herein by reference) provides some information on suitable dendrimer structures.

The dendrimers typically have general formula (XI):

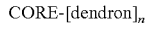

where CORE represents a metal ion or a group containing a metal ion, n represents an integer of 1 or more, and each dendron, which may be the same or different, represents an at least partially conjugated structure comprising aryl and/or heteroaryl structural units.

Preferred aryl and heteroaryl structural units are: substituted and unsubstituted carbazole; substituted and unsubstituted triarylamine; substituted and unsubstituted fluorene, substituted and unsubstituted phenylene; substituted and unsubstituted benzothiadiazole; and substituted or unsubstituted thiophene.

Turning now to the metal complex in the emissive layer, preferred complexes are neutral. To this end, M preferably is surrounded by sufficient charged ligands to make the complex neutral so that there are no non-coordinating anions.

In either the first or the second embodiment, suitable $Ar^s$ groups include aryl or heteroaryl groups containing 5 or 6 membered rings. Suitable heteroaryl groups can have more than one heteroatom in the heteroaryl ring. Examples of suitable $Ar^s$ groups are phenyl and pyridyl.

As mentioned above, generally, the phosphorous atom will be bonded to two further groups (R and R'), in addition to $Ar^s$. Preferably, the two further groups each independently comprise H; a halide group; or a substituted or unsubstituted alkyl, aryl or heteroaryl group.

In one embodiment, preferably, at least one of R and R' is a substituted or unsubstituted aryl or heteroaryl group. More preferably, R and R' each independently is a substituted or unsubstituted aryl or heteroaryl group. Still more preferably, R is a substituted or unsubstituted phenyl group and R' independently is a substituted or unsubstituted phenyl group.

In another embodiment, at least one of R and R' is H, a halide group (preferably F) or a methyl group. These small R and R' groups are preferred when X is a large group in order to avoid crowding.

Turning to the metal M in the complex, suitable metals M include:

lanthanide metals such as cerium, samarium, europium, terbium, dysprosium, thallium, erbium and neodymium; and d-block metals, in particular those in rows 2 and 3 i.e. elements 39 to 48 and 72 to 80, in particular rhenium, tungsten, platinum, palladium, copper, chromium, molybdenum, rhodium, iridium, gold, ruthenium, and osmium.

Referring to the metal M, preferred metals include: rhenium, iridium, tungsten, osmium, platinum and gold, most preferably rhenium and iridium.

Typically, the metal complex will contain other ligands (co-ordinating groups) in addition to the phosphorous containing ligand discussed above.

Of course, the metal complex may contain more than one phosphorous containing ligand as discussed above, where each L may be the same or different.

The nature of the other ligands in the metal complex (other than the phosphorous-containing ligand discussed above) may be selected in order to optimise further compatibility of the metal complex with X. To this end, ligands suitably may be selected from the categories: 1) Electron Transport ligands, 2) Hole Transport ligands and 3) (Semi)conducting ligands. In selecting ligands, account should be taken of possible steric hindrance. Typically, preferred ligands include conjugated ligands, bidentate ligands and ligands comprising at least one nitrogen atom for coordination with the metal.

As mentioned above, $PPh_3$ and indeed other $P(Ar^s)(R)(R')$ containing ligands generally are not emissive/electron accepting ligands. Therefore, in order for the compound to be suitable for emitting light in an LED an emissive ligand also should be coordinated to M in the metal complex. To this end, preferably M will additionally be coordinated to a bidentate emissive ligand:

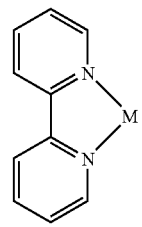

or to two monodentate emissive ligands:

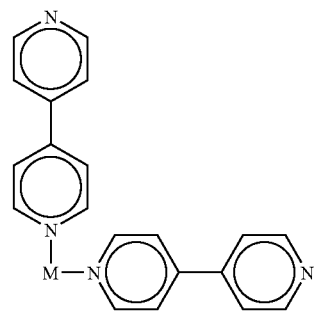

The ligands in the metal complex (other than the phosphorous-containing ligand) can be monodentate (L), bidentate ($L_2$) or tridentate ($L_3$). For bidentate and tridentate ligands the coordinating atoms may be linked in the ligand so as to form a 7, 6, 5 or 4 membered ring when coordinated to M. A 6 membered ring is preferable and a 5 membered ring is most preferable. An Example of a useful tridentate ligand is:

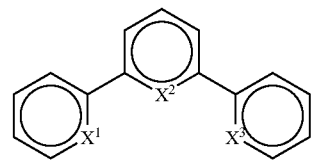

where $X^1$, $X^2$ and $X^3$ independently are selected from N, C, O and S. Preferably, $X^1 = X^2 = X^3 = N$.

A preferred group to coordinate to M is a phenolic group:

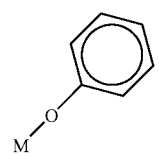

As such, a particularly preferred bidentate ligand is quinolinate.

Other suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals preferably form complexes with carbon or nitrogen donors such as porphyrin or bidentate ligands of formula (XII):

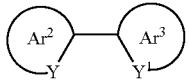

XII wherein $Ar^2$ and $Ar^3$ may be the same or different and are independently selected from optionally substituted aryl or heteroaryl; $Y^1$ and Y may be the same or different and are independently selected from carbon or nitrogen; and $Ar^2$ and $Ar^3$ may be fused together. Ligands wherein Y is carbon and $Y^1$ is nitrogen, or wherein Y and $Y^1$ are both nitrogen are particularly preferred.

Examples of bidentate ligands are illustrated below:

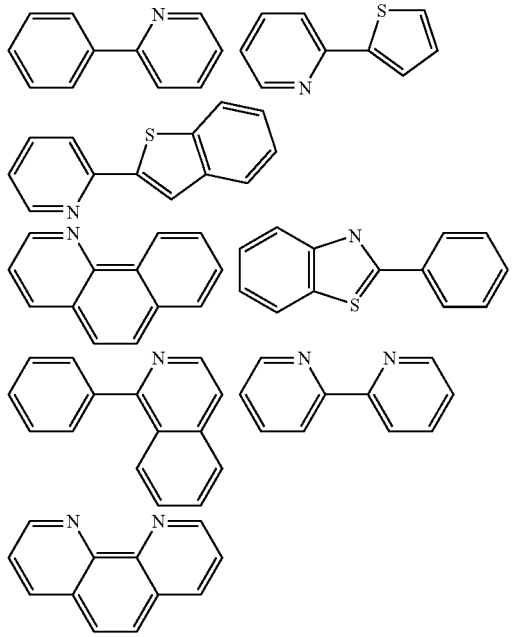

One or both of $Ar^2$ and $Ar^3$ may carry one or more substituents. Preferred substituents are as discussed above.

Other ligands suitable for use with d-block elements include diketonates, in particular acetylacetonate (acac); quinolinate, triarylphosphines and pyridine, each of which may be substituted.

Compounds of most interest, which can be functionalised with X, have the general formula I:

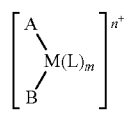

I

M=iridium, rhenium, tungsten, platinum or osmium.

A, B are emissive ligands that may be linked.

At least one L comprises $P(Ar^s)(R)(R')$, preferably phosphine. Where L does not comprise $P(Ar^s)(R)(R')$, it is preferably a strong field ligand, most preferably carbonyl.

L groups may be linked.

m is a number necessary to satisfy the valency of M. For rhenium (I), iridium (III), tungsten (O), osmium (II) and platinum (IV), m is preferably 4. For platinum (II), m is preferably 2 n is 0 or an integer. Where n is an integer, a counterion (Z) is present.

Specific examples are as follows:

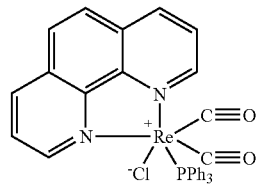

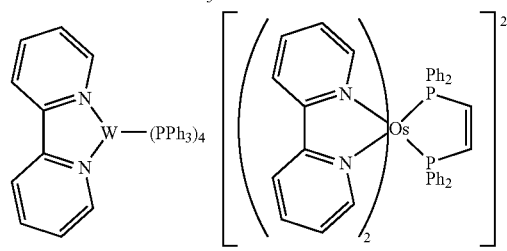

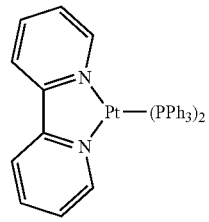

Further complexes of interest, which can be functionalised with X, include rhenium complexes as shown below by general formula II or III. General formula III is most preferred.

$$[A\text{-}Re(L)_5]^+Z^- \qquad (II)$$

wherein at least one L comprises $P(Ar^s)(R)(R')$, preferably phosphine, A is a neutral, emissive ligand; the remaining ligands L are a neutral ligands. In the case of rhenium, the remaining ligands L are preferably strong field ligands, e.g. C≡O or $PR_3$ wherein each R independently represents an optionally substituted alkyl, aryl or heteroaryl group.

Two or more L groups may be linked, e.g. two $PR_3$ groups may form:

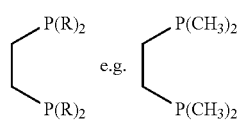

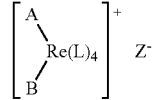

(III)

wherein at least one L comprises $P(Ar^s)(R)(R')$, preferably phosphine; A and B represent neutral, emissive ligands which may optionally be linked, e.g. bipyridyl or phenanthroline. L are as defined above in relation to general formula I or II.

Still further complexes of interest, which can be functionalised with X, include iridium complexes having general formula IV, V, VI, VII or VIII. In these general formulae, at least one ligand comprises P(Ar$^s$)(R)(R') as defined above, preferably phosphine.

  (IV)

  (V)

for iridium, suitable groups for the remaining L in general formulae IV and V include mono- bi- or tridentate ligands, e.g. bipyridyl, phenanthroline, triarylphosphine. Again, preferably at least one of the remaining L comprises a strong field ligand.

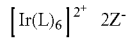  VI wherein at least one L is a charged ligand (L') (e.g. chloride). In a preferred embodiment, there is one charged ligand L' and this is linked to a neutral ligand, (e.g. L-L'=phenylpyridine) as shown in general formula VII:

Preferred osmium complexes, which can be functionalised with X, are those having general formula IX:

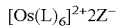

and further complexes analogous to the iridium complexes shown above in general formulae IV to VIII.

As mentioned above, the metal complex may be phosphorescent or fluorescent. Examples of known fluorescent complexes that can be functionalised to give complexes according to the invention by the introduction of X include Al analogues of the aforementioned Ir and Os complexes, in particular:

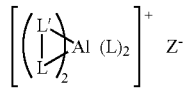

where L and L' are as defined anywhere above.

Preferably for Al, L'-L is quinolinate, in particular 8-quinolinate i.e.

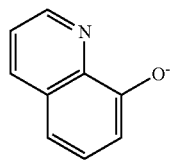

Beryllium, gallium mercury, cadmium and zinc are other metals which form fluorescent complexes. Therefore, other fluorescent complexes according to the invention may include these metals.

In general formulae IV to X at least one ligand must be capable of accepting charge from the metal and capable of emitting light by MLCT.

Light emission can be either fluorescent or phosphorescent. Preferably, light emission is phosphorescent.

The compound optionally may be mixed with other materials in the light emissive layer. It may be desirable for the compound to be present with a host material in the light emissive layer.

In one preferred embodiment, the compound is blended with a host material in the light emissive layer.

The host material may also have charge transporting properties. Hole transporting host materials are particularly preferred such as the optionally substituted hole-transporting arylamine having the following formula:

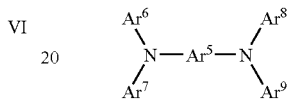

wherein Ar$^5$ is an optionally substituted aromatic group, such as phenyl, or

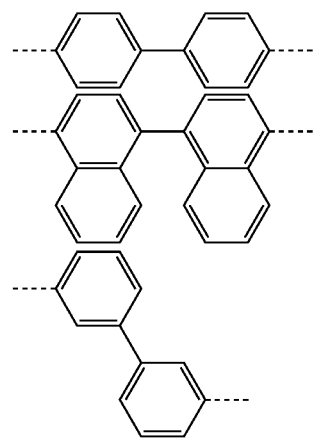

and Ar$^6$, Ar$^7$, Ar$^8$ and Ar$^9$ are optionally substituted aromatic or heteroaromatic groups (Shi et al (Kodak) U.S. Pat. No. 5,554,450. Van Slyke et al, U.S. Pat. No. 5,061,569. So et al (Motorola) U.S. Pat. No. 5,853,905 (1997)). Ar is preferably biphenyl. At least two of Ar$^6$, Ar$^7$, Ar$^8$ and Ar$^9$ may be bonded to either a thiol group, or a group containing a reactive unsaturated carbon-carbon bond. Ar$^6$ and Ar$^7$ and/or Ar$^8$ and Ar$^9$ are optionally linked to form a N containing ring, for example so that the N forms part of a carbazole unit e.g.

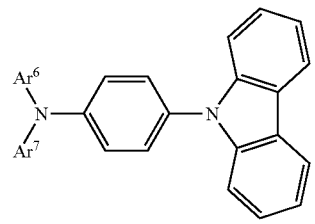

Host materials may alternatively possess electron transporting properties. Examples of electron transporting host materials are azoles, diazoles, triazoles, oxadiazoles, benzoxazoles, benzazoles and phenanthrolines, each of which may optionally be substituted. Particularly preferred substituents are aryl groups, in particular phenyl, oxadiazoles, in particular aryl-substituted oxadiazoles. These host materials may exist in small molecule form or may be provided as repeat units of a polymer, in particular as repeat units located in the backbone of a polymer or as substituents pendant from a polymer backbone. Specific examples of electron transporting host materials include 3-phenyl-4-(1-naphthyl)-5-phenyl-1,2,4-triazole and 2,9-dimethyl-4,7-diphenyl-phenanthroline.

Host materials may be bipolar, i.e. capable of transporting holes and electrons. Suitable bipolar materials preferably contain at least two carbazole units (Shirota, J. Mater. Chem., 2000, 10, 1-25). In one preferred compound, both $Ar^6$ and $Ar^7$ and $Ar^8$ and $Ar^9$ as described above are linked to form carbazole rings and $Ar^5$ is phenyl. Alternatively, a bipolar host material may be a material comprising a hole transporting segment and an electron transporting segment. An example of such a material is a polymer comprising a hole transporting segment and an electron transporting segment as disclosed in WO 00/55927 wherein hole transport is provided by a triarylamine repeat unit located within the polymer backbone and electron transport is provided by a conjugated polyfluorene chain within the polymer backbone. Alternatively, the properties of hole transport and electron transport may be provided by repeat units pendant from a conjugated or non-conjugated polymer backbone.

Specific examples of "small molecule" hosts include 4,4'-bis(carbazol-9-yl)biphenyl), known as CBP, and (4,4',4''-tris (carbazol-9-yl)triphenylamine), known as TCTA, disclosed in Ikai et al. (*Appl. Phys. Lett.,* 79 no. 2, 2001, 156); and triarylamines such as tris-4-(N-3-methylphenyl-N-phenyl) phenylamine, known as MTDATA.

Homopolymers and copolymers may be used as hosts, including optionally substituted polyarylenes such as polyfluorenes, polyspirofluorenes, polyindenofluorenes or polyphenylenes as described above with respect to the hole transporting layer.

Specific examples of host polymers disclosed in the prior art include poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenyl-napthalimide] in Adv. Mater. 1999, 11(4), 285; poly(paraphenylenes) in J. Mater. Chem. 2003, 13, 50-55; poly[9,9'-di-n-hexyl-2,7-fluorene-alt-1,4-(2,5-di-n-hexyloxy) phenylene] as a host for both fac-tris(2-phenylpyridine) iridium(III) and 2,3,7,8,12,13,17,18-octaethyl-21H,23H-porphyrin platinum(II) in J. Chem. Phys. (2003), 118(6), 2853-2864; a random copolymer host of dioctylfluorene and dicyano-benzene in Mat. Res. Symp. Spring Meeting 2003 Book of Abstracts, Heeger, p. 214; and an AB copolymer of a fluorene repeat unit and phenylene repeat unit is disclosed in Mat. Res. Soc. Symp. Proc. 708, 2002, 131.

The concentration of the compound in the host material should be such that the film has a high electroluminescent efficiency. If the concentration of the emissive compound is too high, quenching of luminescence can occur. A concentration in the range 0.01-49 wt %, more preferably 0.5-10 wt %, most preferably 1-3 wt % is generally appropriate.

In the first aspect, with reference to FIG. 1, an organic light emitting diode according to the invention may comprise a substrate 1, an anode 2 (preferably of indium tin oxide), a layer 3 of organic hole injection material, an electroluminescent layer 4 and a cathode 5.

As shown in FIG. 1, usually, the anode is provided on a substrate in the LED according to the invention. Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of a hole injection layer between the anode and the light emissive layer is desirable as it assists hole injection from the anode into the emissive layer. Examples of organic hole injection materials include polyethylenedioxythiophene (PEDT) with a suitable counterion such as poly(styrene sulfonate) as disclosed in EP 0901176 and EP 0947123, or polyaniline as disclosed in U.S. Pat. Nos. 5,723,873 and 5,798,170.

Charge transporting layers (not shown) comprising semiconducting materials may also be provided. A hole transporting layer may be provided between the anode and the emissive layer and an electron transporting layer may be provided between the cathode and the emissive layer.

The cathode is selected so that electrons are efficiently injected into the device and as such may comprise a single conductive material such as a layer of aluminium. Alternatively, it may comprise a plurality of metals, for example a bilayer of calcium and aluminium as disclosed in WO 98/10621. A thin layer of dielectric material such as lithium fluoride optionally may be provided between the light emissive layer and the cathode to assist electron injection as disclosed in, for example, WO 00/48258.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container, optionally with a desiccant, as disclosed in, for example, WO 01/19142.

In a practical device, at least one of the electrodes is semi-transparent in order that light may be emitted. Where the anode is transparent, it typically comprises indium tin oxide. Examples of transparent cathodes are disclosed in, for example, GB 2348316.

A second aspect of the invention provides a method of making a light emitting device as defined in relation to the first aspect. The method comprises the steps of forming the anode, the cathode and the light emissive layer so that the light emissive layer is located between the anode and the cathode. Preferably, the light emissive layer is formed by solution processing. Suitable techniques will be well known to a person skilled in this art.

With respect to making the compound for emitting light that is comprised in the light emissive layer, the compound can be made via an intermediate reactive compound as defined in relation to the third aspect of the invention.

Accordingly, a third aspect of the invention provides a reactive compound for making a compound for emitting light in a light emitting device. In other words, the third aspect of the invention provides a reactive compound for making a light-emitting compound as defined above in the context of the first aspect of the invention. The reactive compound comprises a metal complex. The metal complex contains a metal M and P(Ar$^s$)(R)(R'), where P is coordinated directly to M and where Ar$^s$ is an aryl or heteroaryl group; R and R' are as defined above in relation to the first aspect of the invention; and Ar$^s$ is substituted with one or more (preferably one or two) reactive groups, wherein the or each reactive group (Y,Y') is selected from the group consisting of a triflate group, a halide group, a boronic acid group, a boronic ester group and a borane group. Preferably, the or each reactive group is bromine.

Therefore, reactive compounds according to the third aspect may have a structure as shown in general formula XII or XIII:

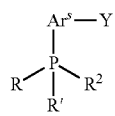
XII

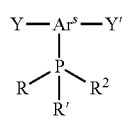
XIII where Ar$^s$, R and R' are as defined above and R$^2$ represents a metal (M) and coordinating ligands, where P is coordinated directly to M. Y and Y' are reactive groups as defined above.

The intermediate reactive compound according to the third aspect can be made, for example, according to the synthetic method shown below:

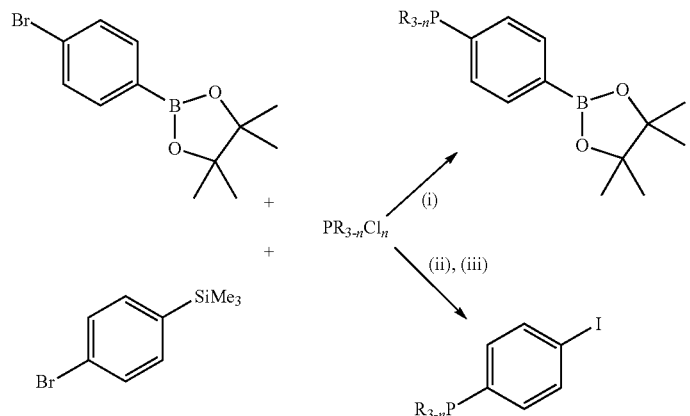

n = 0-3
(i) Mg, thf (ii) Mg, thf (iii) ICl, CH$_2$Cl$_2$

Reference also may be made to Organic Syntheses (1969), 49, 66-9 which discloses synthesis of the reactive phosphine (4-bromophenyl) diphenylphosphine by reaction of diphenylphosphine chloride with 1,4-dibromobenzene.

The above phosphines can then be incorporated into metal complexes in order to form the intermediate reactive compound according to the third aspect of the invention.

As known to those skilled in the art, a general approach to incorporating phosphines shown into a metal complex is to utilise precursor complexes with labile bonds. The phosphine can be added before or after the π acceptor ligand is added. Other approaches utilise oxidative or reductive addition of ligands, photochemical or chemical displacement of ligands.

A general synthetic method for making an intermediate reactive compound according to the third aspect of the invention is shown below:

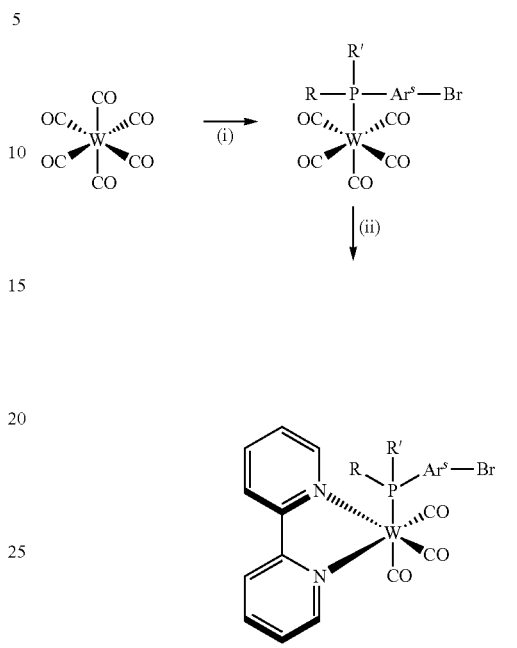

(i) light, P(Ar$^s$—Br)RR', thf; (ii) ONMe$_3$, bpy, MeCN

-continued

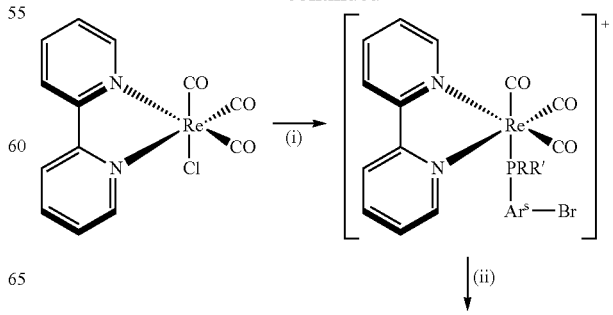

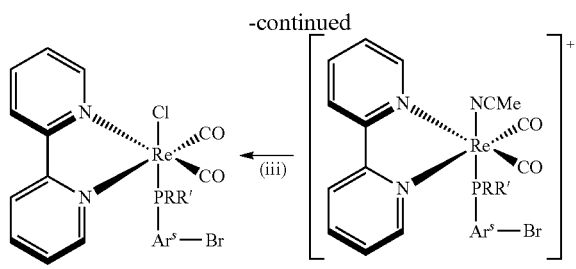

(i) Ag(CF₃SO₃), thf, P(Ar^s—Br)RR'; (ii) light, MeCN; (iii) [NET₄]Cl, CH₂Cl₂

As discussed, these reactive compounds (such as reactive compounds having general formula XII or XIII) can then be incorporated into dendrimeric structures and/or polymers in order to form a light-emitting compound for use in the emissive layer of a device according to the first aspect of the invention. Thus, the fourth aspect of the invention provides the use of the reactive compound as defined in relation to the third aspect of the invention in a method for making a compound, the compound being suitable for use in the light emissive layer of a light emitting device as defined in relation to the first aspect of the invention.

Turning to the fourth aspect of the invention, the light-emitting compound advantageously can be prepared by the well-known Suzuki polymerisation. In overview, this method involves polymerising monomers having at least two reactive groups selected from boronic acid, boronic acid ester (preferably C1-C6), borane (preferably C1-C6) with dihalide or ditriflate functional monomers or monomers having one reactive boronic acid, boronic acid ester (preferably C1-C6), borane (preferably C1-C6) group and one reactive triflate or halide functional group with each other in a reaction mixture in the presence of a catalyst. This method is described in U.S. Pat. No. 5,777,070 and a derivative thereof is described in WO 00/53656. An alternative, is Yamamoto polymerisation as disclosed in Macromolecules, 31 1099-1103 (1998) wherein all monomers are provided with reactive halide groups. The contents of these documents are incorporated herein by reference.

It will be clear from the above methods, that, broadly speaking, the metal complex ultimately can be included in the compound as part of an end-capping group or as part of a monomeric residue. Within these two classes of method, the metal complex may be present in the end-capping reagent or monomer when first added to the reaction mixture. Alternatively, it may be introduced in a subsequent step after the terminated polymer or oligomer has been formed or begun to be formed (i.e. during the reaction). The appropriate method may be selected according to the desirable nature, location and proportion of the metal complex in the compound.

A fifth aspect of the invention provides a compound for emitting light in a light emitting device, said compound comprising a metal complex and X, said metal complex containing a metal (M) and a phosphorous atom that is coordinated directly to M; and an aryl or heteroaryl group Ar^s that is directly bonded to the phosphorous atom; where Ar^s is substituted with X; and characterised in that X comprises an aryl or heteroaryl group. In the fifth aspect of the invention, the compound can have any of the preferred features discussed above in the context of the compound for emitting light in the light emitting device according to the first aspect of the invention, provided that in the compound according to the fifth aspect, X comprises an aryl or heteroaryl group and Ar^s is conjugatively linked to the aryl or heteroaryl group.

A sixth aspect of the invention provides the use of a compound for emitting light, said compound comprising a metal complex and X, said metal complex containing a metal (M) and a phosphorous atom that is coordinated directly to M; and an aryl or heteroaryl group Ar^s that is directly bonded to the phosphorous atom; where Ar^s is substituted with X; and characterised in that X comprises an aryl or heteroaryl group. In the sixth aspect of the invention, the compound can have any of the preferred features discussed above in the context of the compound for emitting light in the light emitting device according to the first aspect of the invention.

The invention claimed is:

1. A light emitting device comprising:
   an anode;
   a cathode;
   a light emissive layer located between the anode and the cathode, said light emissive layer comprising a compound for emitting light, said compound comprising a metal complex and X, said metal complex containing a metal (M) and ligands to satisfy the valency of M including a phosphorous atom that is coordinated directly to M; and an aryl or hetcroaryl group Ar^s that is directly bonded to the phosphorous atom; where Ar^s is substituted with X; and X comprises an aryl or heteroaryl group wherein X is not bount to the metal.

2. A light emitting device according to claim 1, wherein Ar^s is conjugatively linked to the aryl or heteroaryl group of X.

3. A light emitting device according to claim 1, wherein X comprises a polymer or oligomer.

4. A light emitting device according to claim 3, wherein Ar^s is pendant from the backbone of the polymer or oligomer.

5. A light emitting device according to claim 3, wherein Ar^s is part of the backbone of the polymer or oligomer.

6. A light emitting device according to claim 1, wherein M comprises the core of a dendrimer.

7. A light emitting device according to claim 1 wherein Ar^s is a phenyl group.

8. A light emitting device according to claim 1 wherein the phosphorous atom further is bonded to R and optionally R', where R and R' each independently is a substituted or unsubstituted aryl or heteroaryl group.

9. A light emitting device according to claim 8, wherein R is a substituted or unsubstituted phenyl group and R' independently is a substituted or unsubstituted phenyl group.

10. A light emitting device according to claim 1 wherein M is rhenium or iridium.

11. A method of making a light emitting device as defined in claim 1, comprising the steps of forming each of the anode, the cathode, and the light emissive layer so that the light emissive layer is located between the anode and the cathode.

12. A method according to claim 11, comprising forming the light emissive layer by solution processing.

13. A reactive compound for making a compound for emitting in a light emitting device, said reactive compound containing a metal complex, said metal complex containing a metal (M) and P(Ar^s)(R)(R'), where P is coordinated directly to M; Ar^s is an aryl or heteroaryl group; R and R' independently represent H, a halide group, or a substituted or unsubstituted alkyl, aryl or heteroaryl group; and where Ar^s is substituted with one or two reactive groups, wherein the or each reactive group is selected from the group consisting of triflate groups, halide groups, boronic acid groups, boronic ester groups, and borane groups.

14. A reactive compound according to claim 13, wherein $Ar^s$ is a phenyl group.

15. A reactive compound according to claim 13, wherein R is a substituted or unsubstituted phenyl group and R' independently is a substituted or unsubstituted phenyl group.

16. A reactive compound according to claim 13, wherein the or each reactive group is bromine.

17. A compound for emitting light in a light emitting device, said compound comprising a metal complex and X, said metal complex containing a metal (M) and ligands to satisfy the valency of M including a phosphorous atom that is coordinated directly to M; and an aryl or heteroaryl group $Ar^s$ that is directly bonded to the phosphorous atom; where $Ar^s$ is substituted with X; and X comprises an aryl or heteroaryl group and $Ar^s$ is conjugatively linked to the aryl or heteroaryl group wherein X is not bound to the metal.

18. A compound according to claim 17, wherein X comprises a polymer or oligomer.

19. A compound according to claim 18, wherein $Ar^s$ is pendant from the backbone of the polymer or oligomer.

20. A compound according to claim 18, wherein $Ar^s$ is part of the backbone of the polymer or oligomer.

21. A compound according to claim 17, wherein M comprises the core of a dendrimer.

22. A compound according to claim 17, wherein $Ar^s$ is a phenyl group.

23. A compound according to claim 17, wherein the phosphorous atom further is bonded to R and optionally R', where R and R' each independently is a substituted or unsubstituted aryl or heteroaryl group.

24. A compound according to claim 23, wherein R is a substituted or unsubstituted phenyl group and R' independently is a substituted or unsubstituted phenyl group.

25. A compound according to claim 17, wherein M is rhenium or iridium.

* * * * *

UNITED STATES PATENT AND TRADEMARK OFFICE
CERTIFICATE OF CORRECTION

| | | |
|---|---|---|
| PATENT NO. | : 7,956,206 B2 | Page 1 of 1 |
| APPLICATION NO. | : 11/579277 | |
| DATED | : June 7, 2011 | |
| INVENTOR(S) | : Scott Watkins | |

It is certified that error appears in the above-identified patent and that said Letters Patent is hereby corrected as shown below:

In the Specification:

At Column 1, line 32, "exitons" should be -- excitons --.

At Column 5, line 15, "exiton" should be -- exciton --.

At Column 6, line 45, "R'independently" should be -- R' independently --.

At Column 9, line 25, "R'independently" should be -- R' independently --.

At Column 15, lines 48-49, "butylphenylnapthalimide" should be -- butylphenylnaphthalimide --.

At Column 19, line 11, "[NET$_4$]Cl" should be -- [NEt$_4$]Cl --.

In the Claims:

In Claim 1, at Column 20, line 24, "hetcroaryl" should be -- heteroaryl --.

In Claim 1, at Column 20, line 27, "bount" should be -- bound --.

Signed and Sealed this
Seventeenth Day of September, 2013

Teresa Stanek Rea
*Deputy Director of the United States Patent and Trademark Office*